US009344124B2

(12) United States Patent
Lau et al.

(10) Patent No.: US 9,344,124 B2
(45) Date of Patent: May 17, 2016

(54) JAMMER RESISTANT NOISE CANCELLING RECEIVER FRONT END

(71) Applicant: QUALCOMM Incorporated, San Diego, CA (US)

(72) Inventors: Wing Fat Andy Lau, San Diego, CA (US); Hajir Hedayati, College Station, TX (US); Vladimir Aparin, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 182 days.

(21) Appl. No.: 13/875,093

(22) Filed: May 1, 2013

(65) Prior Publication Data

US 2014/0329484 A1 Nov. 6, 2014

(51) Int. Cl.
*H04B 1/10* (2006.01)
*H03F 1/26* (2006.01)

(52) U.S. Cl.
CPC ............... *H04B 1/1027* (2013.01); *H03F 1/26* (2013.01); *H03F 2200/294* (2013.01); *H03F 2200/372* (2013.01)

(58) Field of Classification Search
None
See application file for complete search history.

(56) References Cited

U.S. PATENT DOCUMENTS

| 7,529,529 | B2 | 5/2009 | Taylor |
| 7,949,322 | B2 | 5/2011 | Kim et al. |
| 8,036,623 | B2 | 10/2011 | Chang et al. |
| 8,331,897 | B2 | 12/2012 | Kim et al. |
| 8,406,358 | B1* | 3/2013 | Uehara et al. ............... 375/350 |
| 2002/0032893 | A1* | 3/2002 | Brooks et al. ............... 716/1 |
| 2008/0175307 | A1* | 7/2008 | Brunn et al. ................ 375/148 |
| 2010/0026547 | A1 | 2/2010 | Weissman et al. |
| 2010/0316172 | A1* | 12/2010 | Keehr et al. ................. 375/344 |
| 2011/0124307 | A1 | 5/2011 | Balankutty et al. |
| 2011/0227649 | A1* | 9/2011 | Montalvo .................... 330/254 |
| 2012/0238232 | A1 | 9/2012 | Murphy et al. |
| 2013/0135048 | A1* | 5/2013 | Hyun et al. .................. 330/252 |
| 2013/0271213 | A1* | 10/2013 | Chung et al. ................ 330/149 |

OTHER PUBLICATIONS

International Search Report and Written Opinion—PCT/US2014/035595—ISA/EPO—Oct. 16, 2014.
Murphy D., et al., "A Blocker—Tolerant Wideband Noise—Cancelling Receiver Suitable for Wideband Wireless Applications" IEEE Journal of Solid-State Circuits, IEEE Service Center, Piscataway, NJ, USA, vol. 47, No. 12, Dec. 1, 2012, pp. 2943-2963, XP011485437, ISSN: 0018-9200, DOI: 10.1109/JSSC.2012.2217832 the whole document.

(Continued)

*Primary Examiner* — Lana N Le
(74) *Attorney, Agent, or Firm* — Smith Risley Tempel Blaha LLC

(57) ABSTRACT

Techniques for providing a jammer-resistant noise-cancelling receiver front end with band-pass impedance matching and good power efficiency. In an aspect, the center frequency of the band-pass impedance matching advantageously tracks the local oscillator frequency. In an aspect, first and second receive signal paths are provided, with an R-C network coupled to the output of the second receive signal path. The resistance of the R-C network may be selected to provide band-pass impedance matching to the RF input signal. The current outputs of the first and second signal paths are combined using a trans-impedance amplifier (TIA). In an aspect, the TIA may be implemented using a dual input transconductor amplifier to further optimize the noise performance and power efficiency features of the disclosure.

6 Claims, 12 Drawing Sheets

(56) References Cited

OTHER PUBLICATIONS

Partial International Search Report—PCT/US2014/035595—ISA/EPO—Aug. 21, 2014.
Andrews C., et al., "A Passive-Mixer-First Receiver with Baseband-Controlled RF Impedance Matching, < 6 dB NF, and > 27dBm Wideband IIP3", ISSCC Dig. Tech. Papers, Feb. 2010, pp. 46-47.
Blaakmeer S. C., et al., "The BLIXER, A Wideband Balun-LNA-I/Q-Mixer Topology", JSSC, Dec. 2008, pp. 2706-2715.
Borremans J., et al., "A sub-3dB NF Voltage-Sampling Front-End with +18dBm IIP3 and +2dBm Blocker Compression Point", Proceedings of ESSCIRC, 2010, pp. 402-405.
Mirzaie A., et al., "A 65nm CMOS Quad-Band SAW-Less Receiver for GSM/GPRS/EDGE", IEEE Symposium on VLSI Circuits, 2010, pp. 179-180.
Murphy D., et al., "A Blocker—Tolerant Wideband Noise—Cancelling Receiver with a 2dB Noise Figure," ISSCC Dig. Tech. Papers, Feb. 2012, pp. 74-75.

\* cited by examiner

JAMMER RESISTANT NOISE CANCELLING RECEIVER FRONT END

BACKGROUND

1. Field

The disclosure relates to communications circuitry, and in particular, to a receiver front end featuring jammer resistance and noise cancellation.

2. Background

In designing communications receivers, it is generally desirable to provide a low-noise front-end to overcome noise contributions from subsequent stages of a receive chain. Certain prior art implementations employ a noise cancelling architecture for the receiver front end, wherein signal currents generated by two signal paths are weighted and summed together to cancel noise.

Several considerations arise in the design of such noise cancelling receivers. In particular, additional filtering can be provided in the receiver to achieve adequate rejection of out-of-band interferers (or jammers). However, such additional filtering usually results in higher insertion loss. The receiver may also be designed for better linearity, though generally at the cost of higher power consumption and/or higher noise.

In some implementations, to perform baseband combining of signal currents from the two signal paths, the receiver may be provided with additional trans-impedance amplifiers or baseband combiners at the back end. Alternatively, resistor strings may be used to perform the summation. However, these approaches suffer from various drawbacks, e.g., higher power consumption in the case of additional amplifiers and/or combiners, or limited signal headroom in the case of resistor strings due to DC (direct-current) IR (current-resistance) drops.

It would thus be desirable to provide techniques for designing a noise cancelling receiver front end that provides significant out-of-band interferer rejection, while further consuming less power than existing prior art implementations.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Figure 1:
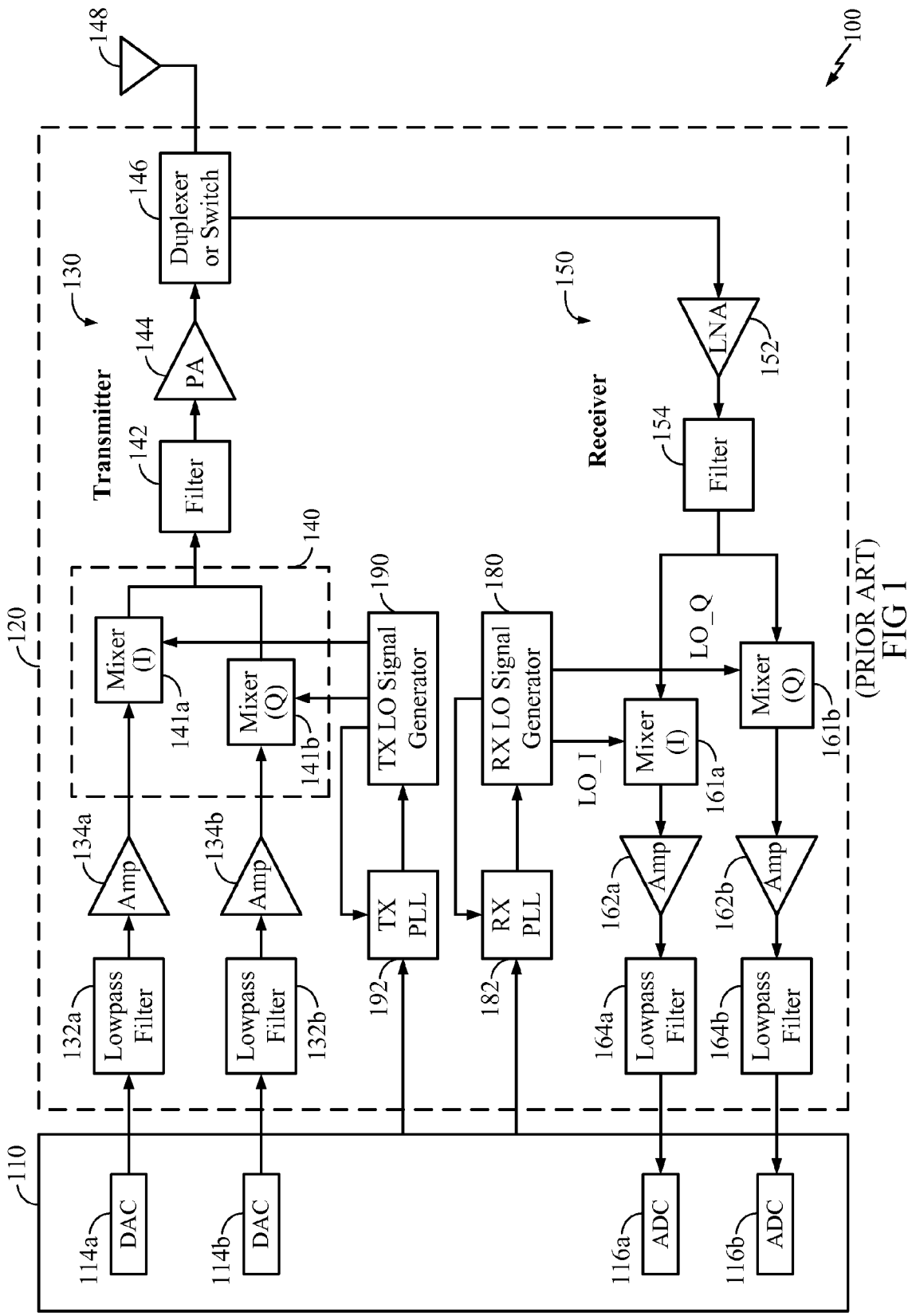
FIG. 1 illustrates a block diagram of a design of a prior art wireless communication device in which the techniques of the present disclosure may be implemented.

FIG. 1 illustrates a block diagram of a design of a prior art wireless communication device 100 in which the techniques of the present disclosure may be implemented. FIG. 1 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, some blocks shown in FIG. 1 may be absent in some implementations, whereas other circuit blocks not shown in FIG. 1 may also be used to condition the signals in the transmitter and receiver. Unless otherwise noted, any signal in FIG. 1, or any other figure in the drawings, may be either single-ended or differential. Some circuit blocks in FIG. 1 may also be omitted.

In the design shown in FIG. 1, wireless device 100 includes a transceiver 120 and a data processor 110. The data processor 110 may include a memory (not shown) to store data and program codes. Transceiver 120 includes a transmitter 130 and a receiver 150 that support bi-directional communication. In general, wireless device 100 may include any number of transmitters and/or receivers for any number of communication systems and frequency bands. All or a portion of transceiver 120 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. In the exemplary embodiment shown, the data processor 110 includes digital-to-analog-converters (DAC's) 114a and 114b for converting digital signals generated by the data processor 110 into the I and Q analog output signals, e.g., I and Q output currents, for further processing.

Within transmitter 130, lowpass filters 132a and 132b filter the I and Q analog output signals, respectively, to remove undesired images caused by the prior digital-to-analog conversion. Amplifiers (Amp) 134a and 134b amplify the signals from lowpass filters 132a and 132b, respectively, and provide I and Q baseband signals. An upconverter 140 upconverts the I and Q baseband signals with I and Q transmit (TX) local oscillator (LO) signals from a TX LO signal generator 190 and provides an upconverted signal. A filter 142 filters the upconverted signal to remove undesired images caused by the frequency upconversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148.

In the receive path, antenna 148 receives signals transmitted by base stations and provides a received RF signal, which is routed through duplexer or switch 146 and provided to a low noise amplifier (LNA) 152. The duplexer 146 is designed to operate with a specific RX-to-TX duplexer frequency separation, such that RX signals are isolated from TX signals. The received RF signal is amplified by LNA 152 and filtered by a filter 154 to obtain a desired RF input signal. Downconversion mixers 161a and 161b mix the output of filter 154 with I and Q receive (RX) LO signals (i.e., LO_I and LO_Q) from an RX LO signal generator 180 to generate I and Q baseband signals. The I and Q baseband signals are amplified by amplifiers 162a and 162b and further filtered by lowpass filters 164a and 164b to obtain I and Q analog input signals, which are provided to data processor 110. In the exemplary embodiment shown, the data processor 110 includes analog-to-digital-converters (ADC's) 116a and 116b for converting the analog input signals into digital signals to be further processed by the data processor 110.

In FIG. 1, TX LO signal generator 190 generates the I and Q TX LO signals used for frequency upconversion, while RX LO signal generator 180 generates the I and Q RX LO signals used for frequency downconversion. Each LO signal is a periodic signal with a particular fundamental frequency. A PLL 192 receives timing information from data processor 110 and generates a control signal used to adjust the frequency and/or phase of the TX LO signals from LO signal generator 190. Similarly, a PLL 182 receives timing information from data processor 110 and generates a control signal used to adjust the frequency and/or phase of the RX LO signals from LO signal generator 180.

In certain implementations (not shown in FIG. 1), a balun may be provided between the output of the LNA 152 and the mixers 161a, 161b of the receiver 150. The balun may convert a single-ended signal to a differential signal, and may include, e.g., a transformer that mutually couples a signal from a primary winding to a secondary winding.

Figure 2:
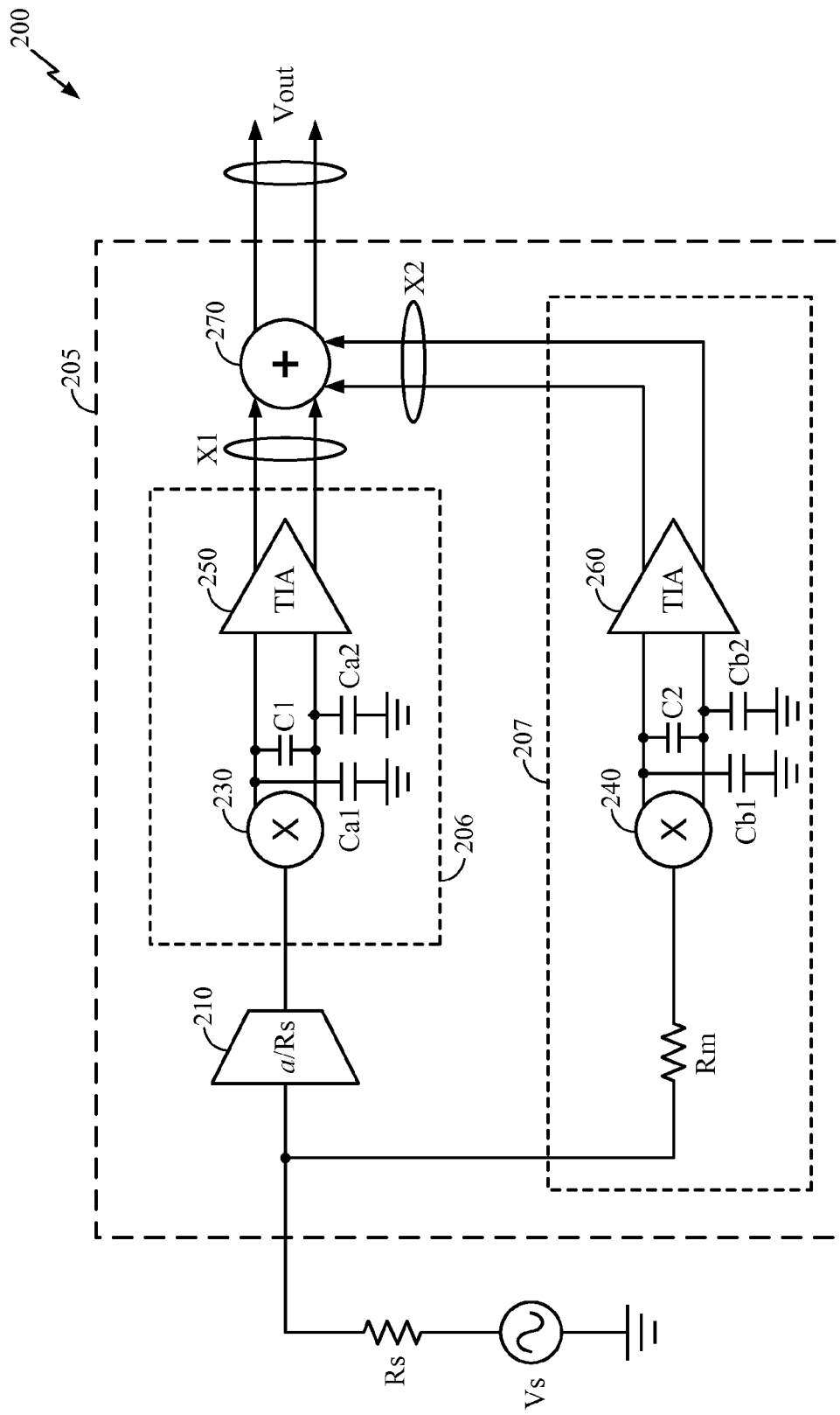
FIG. 2 illustrates a prior art implementation of a noise cancelling RF receiver front end.

In certain implementations, certain elements of the receiver 150, including the LNA 152, may be replaced by a noise cancelling receiver architecture to improve the noise performance of the receiver front end. FIG. 2 illustrates a prior art implementation 200 of a noise cancelling receiver front end. Note the implementation 200 is shown for illustrative purposes only, and is not meant to limit the scope of the present disclosure.

In FIG. 2, an input voltage Vs is coupled to a noise-cancelling receiver 205. In one implementation, the input voltage Vs may correspond to the output of the duplexer 146 in FIG. 1, e.g., in a radio implementation wherein the receiver 205 replaces the LNA 152 and certain other elements of the receiver 150. For example, in certain implementations, the receiver front end 200 may replace circuitry in the receiver 150 from the LNA 152 to the amplifiers 162a, 162b, etc. The signal voltage Vs is coupled via a source resistance Rs to a dual receive signal path of the receiver 205 that includes a first receive signal path 206 and a second receive signal path 207.

The receiver 205 includes a trans-conductor 210 having trans-conductance a/Rs, wherein a is a predetermined gain factor. The output of the trans-conductor 210 is coupled to a first mixer 230 of the first receive signal path 206. The first mixer 230 may mix its input with a local oscillator signal (not shown in FIG. 2) to mix the input signal down in frequency, e.g., to a baseband frequency. The output of first mixer 230 is further coupled to a first trans-impedance amplifier (TIA) 250 to generate a differential output voltage X1. Note a capacitor C1 may couple the differential nodes of the output of the first mixer 230 to each other. Capacitors Ca1, Ca2 are provided to couple the differential output nodes of the mixer 230 to ground. In an exemplary embodiment, the capacitances of Ca1 and Ca2 may be equal to each other, e.g., set to a common value Ca. Furthermore, capacitors Cb1 and Cb2 couple each node of the differential mixer output to ground.

The second receive signal path 207 includes an input resistance Rm coupled to a second mixer 240. In an exemplary embodiment, the second mixer 240 is of a passive type, e.g., utilizes one or more switches to perform the mixing operation. Accordingly, the second mixer 240 is also denoted herein as the "passive mixer." In certain implementations, Rm may correspond to, e.g., the resistance of an actual physical resistor provided in the circuit, the switch resistance of the passive implementation of mixer 240, etc. The output of the second mixer 240 is coupled to a second trans-impedance amplifier (TIA) 260 having a gain b times that of the first trans-impedance amplifier 250, to generate a differential output voltage X2. In an implementation, b may be related to a, e.g., b may be made substantially equal to a. Note a capacitor C2 may couple the differential nodes of the output of the second mixer 240.

An adder 270 is provided to add the outputs X1 and X2 of the first and second receive signal paths, respectively, to generate an overall output voltage Vout for the receiver 205. Per the receiver circuitry shown in FIG. 2, it will be appreciated that noise in X2 of the second receive signal path 207 (e.g., associated with Rm and the TIA 260) will be cancelled by the output X1 of the first receive signal path 206. See, e.g., David Murphy et al., "A Blocker-Tolerant Wideband Noise-Cancelling Receiver with a 2 dB Noise Figure," ISSCC Dig. Tech. Papers, pp. 74-75, February 2012.

Note the input impedance of the receiver 205 may be adjusted by appropriately selecting the resistance of Rm. In this manner, the input to the receiver 205 may be impedance-matched to the source resistance Rs for optimal power delivery. Note, however, that Rrn by itself provides no inherent frequency selectivity, which would be desirable to, e.g., help prevent subsequent signal distortion arising from strong out-of-band jammers, such as due to circuit non-linearity, or arising from a strong transmitted signal on the same device (e.g., as coupled through duplexer 146 from the transmitter 130 in FIG. 1).

Accordingly, it would be desirable to provide efficient techniques for designing a noise cancelling RF receiver front end featuring band-pass frequency selectivity in addition to wide-band impedance matching.

Figure 3:
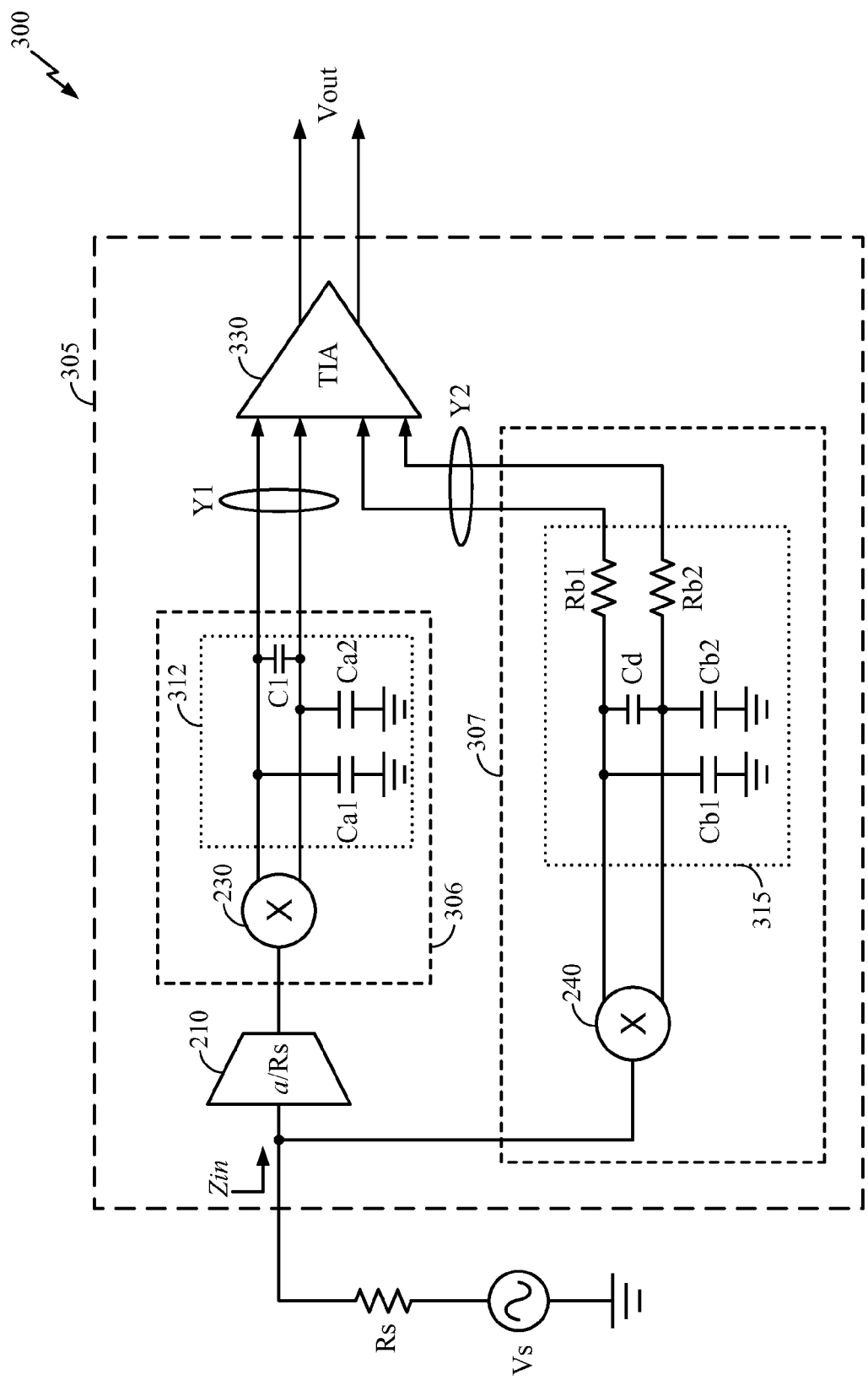
FIG. 3 illustrates an exemplary embodiment of the present disclosure.

FIG. 3 illustrates an exemplary embodiment 300 of the present disclosure. Note similarly labeled elements in FIGS. 2 and 3 may correspond to elements performing similar functions, unless otherwise noted.

In FIG. 3, the receiver 305 includes a trans-conductor 210 coupled to a first receive signal path 306 having a first mixer 230. Note a capacitor C1 may couple the differential nodes of the output of the first mixer 230. Capacitors Ca1, Ca2 are provided to couple the differential output nodes of the mixer 230 to ground. In an exemplary embodiment, the capacitances of Ca1 and Ca2 may be equal to each other, e.g., set to a common value Ca. The first receive signal path 306 generates a differential output Y1. In FIG. 3, the capacitors C1, Ca1, and Ca2 are collectively labeled 312.

The second receive signal path 307 includes a second mixer 240, which may be a passive mixer, and whose output is coupled to a baseband resistance-capacitance (RC) network 315. In particular, capacitors Cb1 and Cb2 couple each node of the differential mixer output to ground. In an exemplary embodiment, the capacitances of Cb1 and Cb2 may be equal to each other, e.g., set to a common value Cb. Capacitor Cd couples the nodes of the differential mixer output to each other. Resistors Rb1 and Rb2 series-couple the differential mixer output nodes to the differential output Y2 of the second receive signal path 307. In an exemplary embodiment, the resistances of Rb1 and Rb2 may be equal to each other, e.g., set to a common value Rb.

In an exemplary embodiment, either or both of the mixers 230, 240 may be implemented as single- or double-balanced passive mixers. Accordingly, within the signal bandwidth of the R-C network 315 determined by Rb, Cd, and Cb, the input impedance Zin of the receiver 305 may then be adjusted by appropriately choosing Rb (or Rb1 and Rb2 independently, in certain exemplary embodiments).

In general, assuming the input impedance of the trans-conductor 210 is large, the frequency-dependent input impedance $Zin(\omega)$ may be expressed as follows (Equation 1):

$$Zin(\omega) \approx Rsw + N|a1|^2 [Zbb(\omega-\omega lo) + Zbb(\omega+\omega lo)]; \qquad \text{(Eq. 1)}$$

wherein $\omega$ is the frequency at which $Zin(\omega)$ is to be evaluated in radians per second, $\omega lo$ is the local oscillator frequency in radians per second, Rsw is the equivalent on-resistance of each switch transistor of the second mixer 240, N is the total number of LO signal phases (as further illustrated hereinbelow, e.g., with reference to FIG. 4D), Zbb is the baseband impedance over one phase (e.g., of an N-phase cycle), and a1 is the magnitude of the fundamental Fourier coefficient of the LO waveform.

Note outside the signal bandwidth of the RC network 315, the magnitude of the input impedance of the receiver 305 decreases as input frequency deviates from the LO frequency, thereby degrading power delivery from the source voltage Vs to the receiver 305 outside such signal bandwidth. Accordingly, band-pass selectivity is effectively provided by the R-C network 315 to reject out-of-band signals, e.g., out-of-band jammers and/or Tx signals coupled from the transmitter portion of the transceiver, as such signals would be greatly attenuated prior to mixing to baseband.

From FIG. 3, it will be appreciated that the RF (bandpass) bandwidth BWrf associated with the receiver 305 (e.g., as dominated by the mixer 240) may be expressed as follows (Equation 2):

$$BWrf \propto BWbb = 1/(2\pi Rb (Cb+2 Cd)); \qquad \text{(Eq. 2)}$$

wherein BWbb is the (low-pass) baseband bandwidth associated with Zbb, and Rb, Cb, Cd represent the resistance or capacitance values of the corresponding passive components described herein with reference to FIG. 3.

In certain exemplary embodiments, a low noise amplifier (or LNA, not shown in FIG. 3) can be added to the exemplary embodiment 300, e.g., provided between the source resistance Rs and the receiver 305, to further improve the receiver performance. In particular, the LNA may provide, e.g., improved LO-RF isolation and reduced sensitivity to source impedance.

In an aspect of the present disclosure, the differential outputs Y1 and Y2 of the first and second receive signal paths 306, 307 may be combined using a single trans-impedance amplifier (TIA) 330 to generate a differential output voltage Vout. In particular, note that, in contrast with the receiver 205 of FIG. 2, wherein a separate trans-impedance amplifier (TIA) 250, 260 is provided for each of signal paths 206, 207, the receiver 305 includes a single trans-impedance amplifier (TIA) 330 for combining Y1 and Y2. It will be appreciated that the use of a single trans-impedance amplifier, as opposed to multiple TIA's, advantageously reduces die area and power consumption, and further reduces noise and distortion.

Note while only one mixer (230 or 240) is shown for each receive signal path (306 or 307) in FIG. 3 for ease of illustration, it will be appreciated that the discussion herein readily applies to signal paths accommodating more than one mixer each, and to receivers employing more than two signal paths. For example, the signal paths 306, 307 may each include an I-mixer and a Q-mixer, with each mixer configured analogously to the manner in which the single mixer 230 or 240 is shown configured in FIG. 3. Such alternative exemplary embodiments are contemplated to be within the scope of the present disclosure.

Figure 4A:
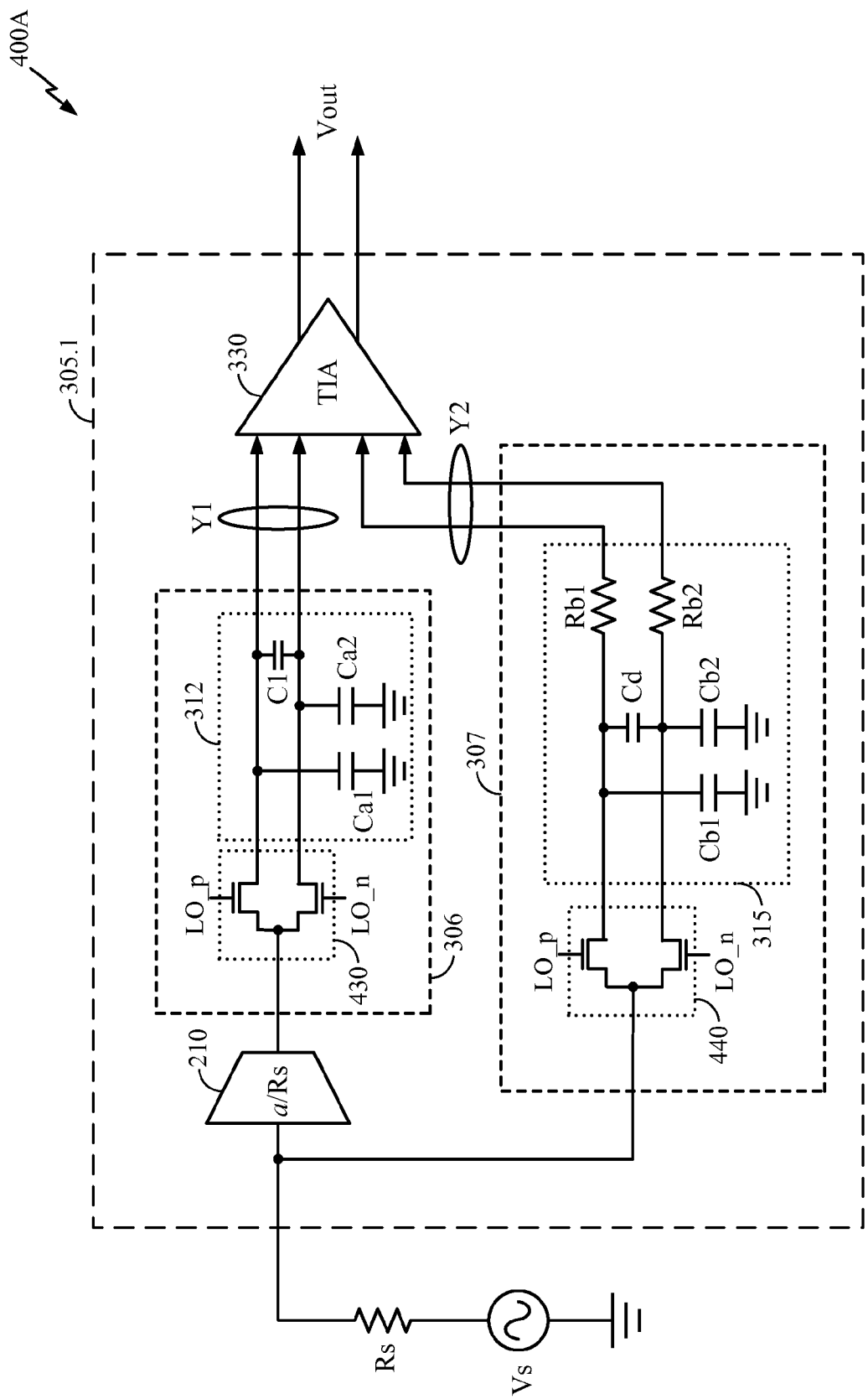
FIGS. 4A, 4B, 4C, and 4D illustrate exemplary embodiments of the present disclosure utilizing passive mixers.

FIG. 4A illustrates an exemplary embodiment 400A of a receiver incorporating a passive mixer according to the present disclosure. Note the exemplary embodiment 400A is shown for illustrative purposes only, and is not meant to limit the scope of the present disclosure to any particular types of passive mixers shown. In FIG. 4A, a receiver 305.1 includes a mixer 430 of the first signal path 306, wherein the mixer 430 includes a pair of transistors driven by signals LO_p and LO_n corresponding to differential voltages of a local oscillator signal. Similarly, the mixer 440 of the second signal path 307 also includes a pair of transistors driven by LO_p and LO_n.

Figure 4B:
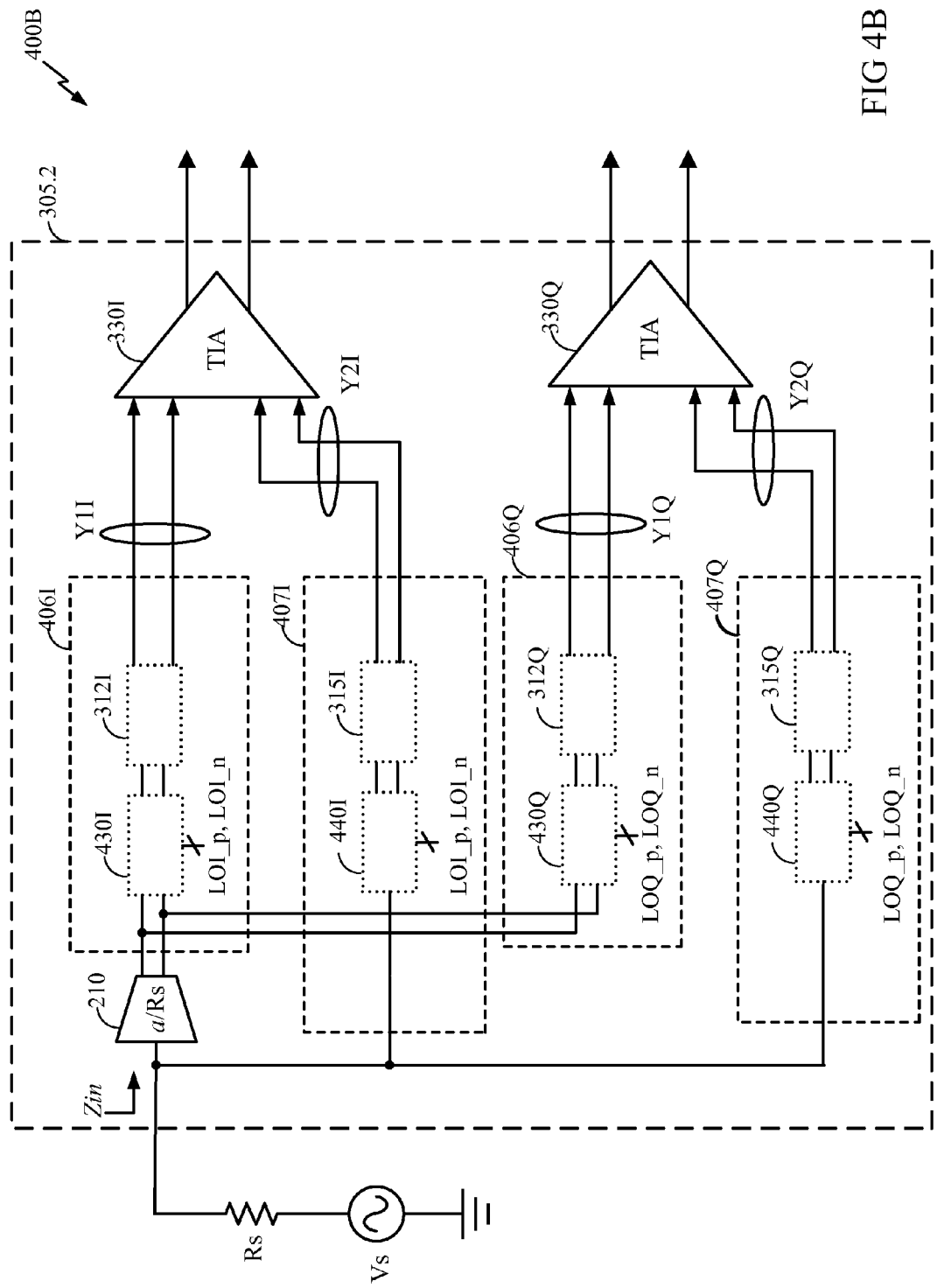

FIG. 4B illustrates an alternative exemplary embodiment 400B showing a receiver 305.2 incorporating multiple signal paths, each with a passive mixer, according to the present disclosure. In FIG. 4B, a first in-phase signal path 406I includes an in-phase mixer block 430I coupled to an in-phase differential LO signal LOI_p, LOI_n. A second in-phase signal path 407I includes an in-phase mixer block 440I coupled to the same in-phase differential LO signal LOI_p, LOI_n. On the other hand, a first quadrature signal path 406Q includes a quadrature mixer block 430Q coupled to a quadrature differential LO signal LOQ_p, LOQ_n. A second quadrature signal path 407Q includes a quadrature mixer block 440Q coupled to the same quadrature differential LO signal LOQ_p, LOQ_n. Note in FIG. 4B, the differential input to each of the mixers 430I, 430Q is derived from the output of the transconductor 210.

In an exemplary embodiment, each of the mixer blocks 430I, 430Q, 440I, 440Q may have the same passive mixer architecture as explicitly shown in FIG. 4A for the mixer 430 or 440. Similarly, blocks 312I, 312Q may each have the same elements as explicitly shown for block 312 in FIG. 4A, and blocks 315I, 315Q may each have the same elements as explicitly shown for block 315 in FIG. 4A. The in-phase signal paths 406I, 407I generate outputs Y1I and Y2I to be combined by a TIA 330I. Similarly, the quadrature signal paths 406Q, 407Q generate outputs Y1Q and Y2Q to be combined by a TIA 330Q.

Figure 4C:
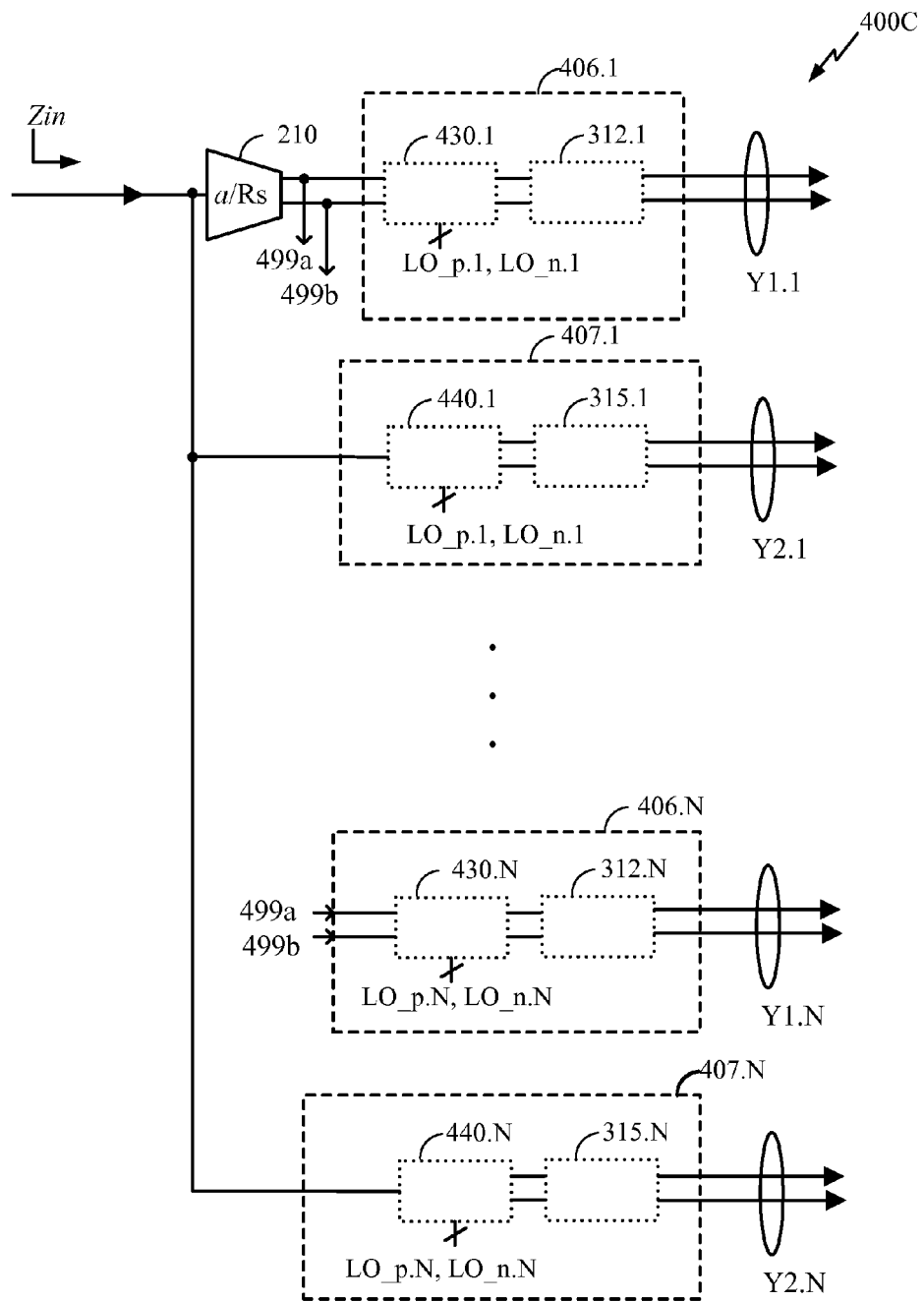

FIG. 4C illustrates an alternative exemplary embodiment 400C wherein multi-phase passive mixers are employed. In FIG. 4C, a plurality N of first and second signal paths 406 and 407 is provided. In particular, signal paths 406.1 through 406.N and 407.1 through 407.N may each adopt the architecture of corresponding signal paths 406 and 407 in FIG. 4A. Local oscillator signals LO_p.1 and LO_n.1 through LO_p.N and LO_n.N are provided to corresponding mixer blocks 430.1 and 440.1 through 430.N and 440.N. Note in FIG. 4C, the differential input 499a, 499b to each of the mixers 430.1 through 430.N is derived from the output of the trans-conductor 210.

Figure 4D:
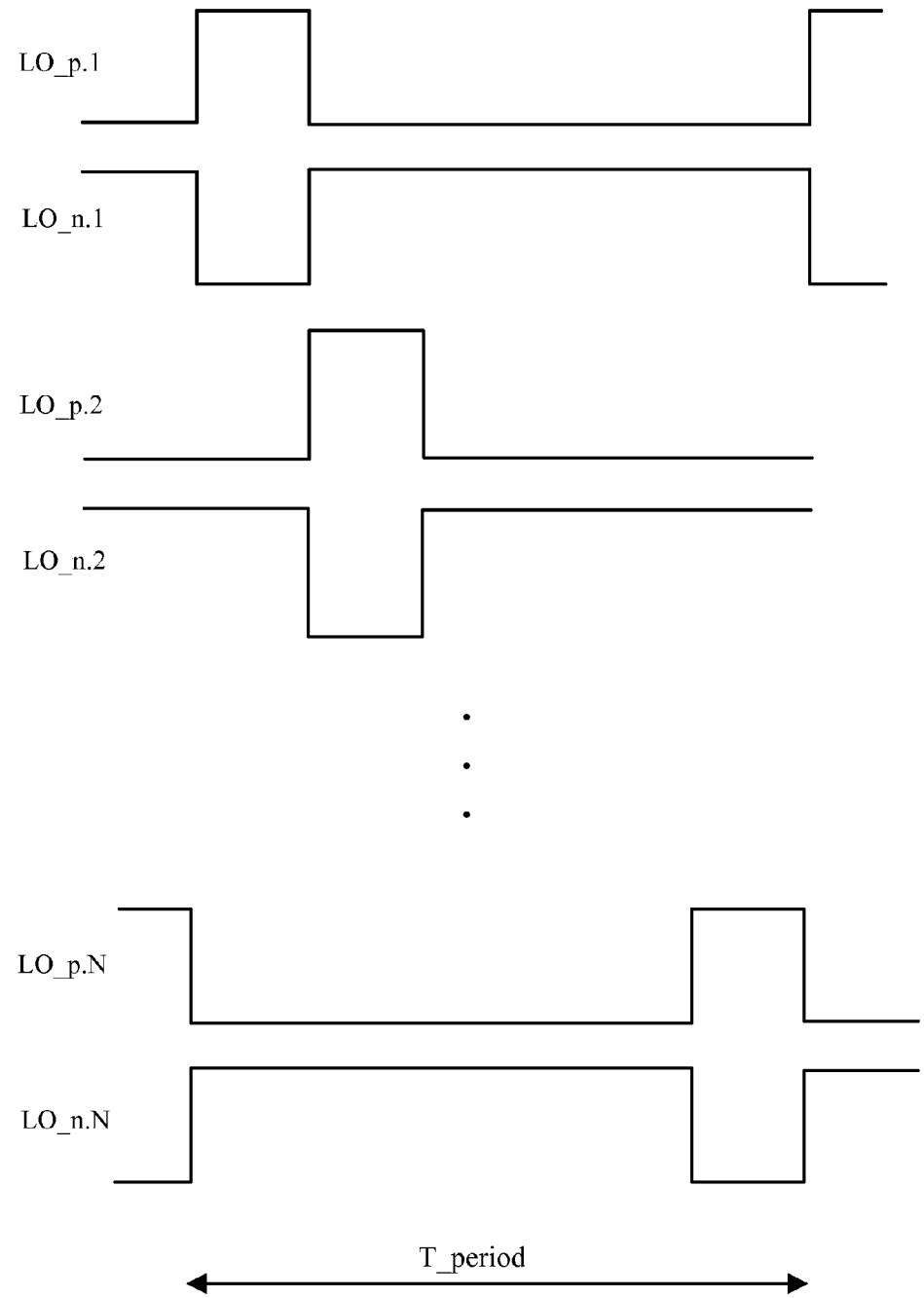

The local oscillator signals labeled in FIG. 4C may be configured as multi-phase local oscillator signals, e.g., as shown in FIG. 4D. In particular, LO_p.1 and LO_n.1 are 180 degrees out of phase with each other, LO_p.2 and LO_n.2 are 180 degrees out of phase with each other, etc. Furthermore, the differential signal LO_p.1, LO_n.1 may be, e.g., 180/N degrees out of phase with a differential signal LO_p.2, LO_n.2 (not explicitly shown in FIG. 4D), etc. In general, a multi-phase mixing scheme may be implemented for an arbitrary number N of phases. It will be appreciated that a larger number of phases N for the mixing scheme may advantageously suppress the undesired harmonic response of a switching mixer driven by one phase only.

Figure 5:
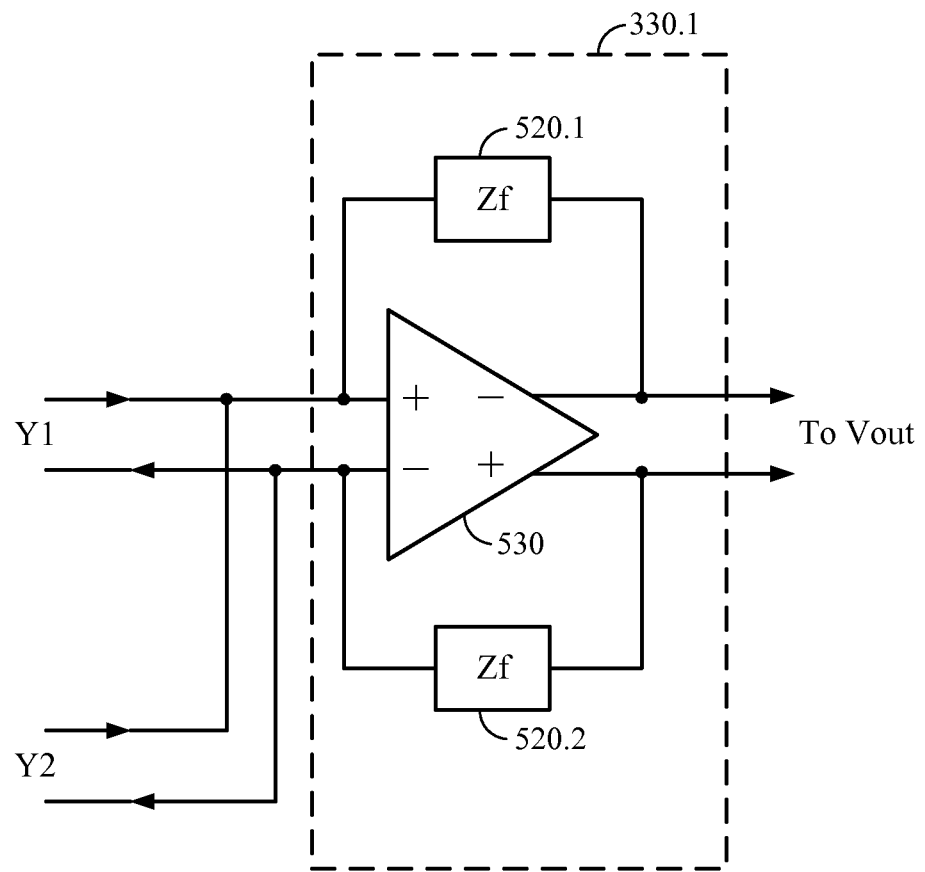
FIG. 5 illustrates an exemplary embodiment of a trans-impedance amplifier.

FIG. 5 illustrates an exemplary embodiment 330.1 of a trans-impedance amplifier 330. Note the TIA 330.1 is shown for illustrative purposes only, and is not meant to limit the scope of the present disclosure to any particular TIA designs explicitly shown.

In FIG. 5, differential inputs Y1 and Y2 are provided to the TIA 330.1. The TIA 330.1 includes a single differential operational amplifier (op amp) 530 having a differential input and a differential output. It will be appreciated that, through feedback provided by the impedances 520.1, 520.2 (each having impedance value corresponding to Zf), the differential currents from Y1 and Y2 are effectively summed, and the summed currents are then converted to a differential output voltage of the op amp 530. Note the voltage output of the op amp 530 may be coupled to, e.g., Vout of the receiver 305.

In the exemplary embodiment 330.1, the TIA is shown implemented as a single input trans-impedance amplifier, e.g., the TIA 330.1 accepts a single differential input accommodating currents from both Y1 and Y2. Accordingly, to cancel noise from Rb1, Rb2, the trans-conductance of the trans-conductor 210 may be programmed to be 1/Rs, wherein the gain factor a has been set to 1. Note in some exemplary embodiments, a may be tuned to differ slightly from 1 depending on the design, and such alternative exemplary embodiments are contemplated to be within the scope of the present disclosure. Further note that in alternative exemplary embodiments (e.g., as described with reference to FIGS. 6-8), the TIA may be a dual-input trans-impedance amplifier, e.g., accepting two separate single-ended or differential signals as inputs. Such alternative exemplary embodiments are contemplated to be within the scope of the present disclosure.

Figure 6:
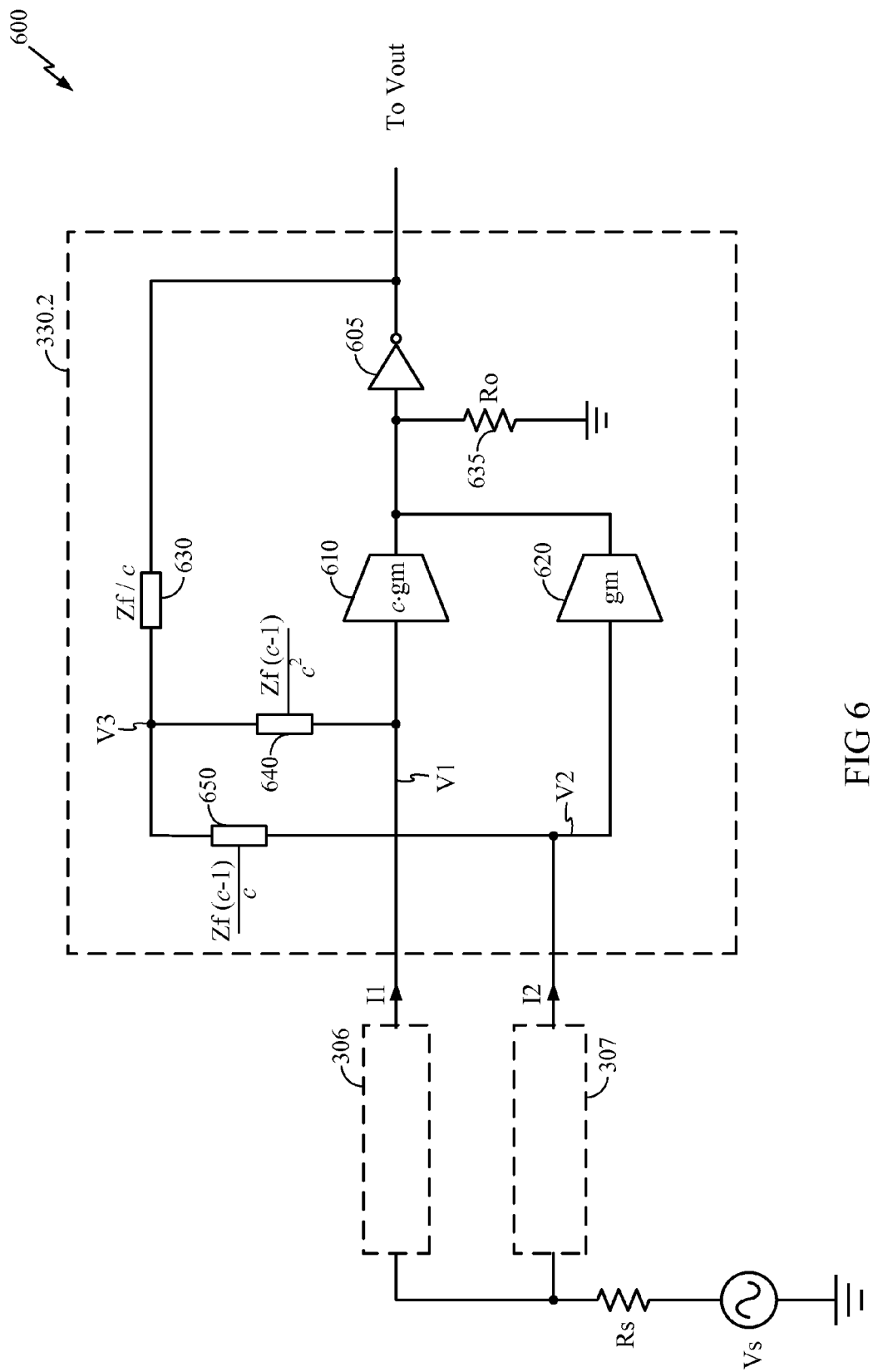
FIG. 6 illustrates a receiver topology illustrating a dual-input trans-impedance amplifier according to the present disclosure.

FIG. 6 illustrates a receiver topology 600 illustrating a dual-input trans-impedance amplifier 330.2 according to the present disclosure. It will be understood that certain aspects of the topology 600 may correspond to, e.g., the receiver 300 shown in FIG. 3, while additional aspects not found in the receiver 300 are also incorporated. Note that FIG. 6 is shown for illustrative purposes only, and is not meant to limit the scope of the present disclosure to any particular implementation of a trans-impedance block shown. Furthermore, while certain signals are depicted as single-ended signals in FIG. 6 for ease of illustration, it will be appreciated that the techniques disclosed herein may readily accommodate differential signals. Certain elements, including capacitors and resistors, have been omitted from FIG. 6 for ease of illustration, although one of ordinary skill in the art will appreciate that such elements may readily be incorporated into the simplified topology 600 according to the techniques of the present disclosure. Such alternative exemplary embodiments are contemplated to be within the scope of the present disclosure.

In FIG. 6, a block 330.2 implements the trans-impedance block 330 by splitting constituent trans-conductors into two blocks 610 and 620, with a trans-conductance ratio of c to 1. The input to block 610 is coupled to the current I1 generated by block 306, while the input to block 620 is coupled to the current I2 generated by block 307. Note the dual-input architecture of block 330.2 stands in contrast to the single-input architecture of block 330.1 in FIG. 5, wherein the current outputs of both block 306 and block 307 are coupled to a single op amp 530.

In FIG. 6, it will be further noted that the feedback network coupling Vout to the inputs of blocks 610 and 620 is split amongst impedances 630, 640, 650. In an exemplary embodiment, Zf may correspond to, e.g., the impedance associated with a resistor and a capacitor coupled in parallel. Impedances 630, 640, and 650 may be chosen as shown in FIG. 6, e.g., to yield a trans-impedance gain for I2 which is c times the trans-impedance gain for I1. One of ordinary skill in the art will appreciate that alternative configurations of a feedback network for coupling Vout back to the input of the trans-impedance block 330.2 may readily be derived in light of the present disclosure. For example, the gains of the feedback networks may readily be modified, and additional elements (e.g., series or parallel elements) inserted into or removed from the configurations shown. Such alternative exemplary embodiments are contemplated to be within the scope of the present disclosure.

In the exemplary embodiment 600, a feedback impedance 630 having value Zf/c couples the output voltage Vout to an intermediate node voltage V3 of the TIA 330.2. A feedback impedance 640 having value $Zf\,(c-1)/c^2$ couples V3 to the input of the first trans-conductor 610, while a feedback impedance 650 having value $Zf\,(c-1)/c$ couples V3 to the input of the second trans-conductor 620. According to these impedance values, the current I1 from the first signal path 306 is converted to a voltage V1 at the input of the first trans-conductor 610, and the current I2 from the second signal path 307 is converted to a voltage V2 at the input of the second trans-conductor 620. In particular, V1 and V2 may be expressed as follows (Equations 3a, 3b):

$$V1 = V3 + I1 \cdot \frac{Zf(c-1)}{c^2};  \quad\text{(Eq. 3a)}$$

$$V2 = V3 + I2 \cdot \frac{Zf(c-1)}{c}; \quad\text{(Eq. 3b)}$$

wherein V3 is the voltage at the node indicated within the TIA 330.2.

In an exemplary embodiment, c may be set equal to I1/I2, i.e., the ratio between the output signal currents expected from the first and second signal paths 306, 307. With c=I1/I2, V1 will be equal to V2, and in particular (Equations 4a and 4b):

$$V1 = V3 + \frac{I2^2}{I1} Zf(c-1); \quad \text{(Eq. 4a)}$$

$$V2 = V3 + I2 \cdot \frac{Zf(c-1)}{c} \quad \text{(Eq. 4b)}$$

$$= V3 + \frac{I2^2}{I1} Zf(c-1).$$

For small AC signals V1 and V2 relative to Vout, then V1 and V2 may both be approximated as zero, and Equations 4a and 4b may thus be re-written as follows (Equations 5a and 5b):

$$V3 + \left(\frac{I2^2}{I1}\right)[ZF(c-1)] = V3 + I2\left[\frac{Zf(c-1)}{c}\right] \quad \text{(Eq. 5a)}$$

$$= 0;$$

$$V3 = -\frac{I2}{c} Zf(c-1). \quad \text{(Eq. 5b)}$$

From Equation 5b, the output voltage Vout of the TIA 330.2 may be written as follows (Equations 6a, 6b, and 6c):

$$Vout = V3 - (I1 + I2)\frac{Zf}{c}; \quad \text{(Eq. 6a)}$$

$$Vout = -\frac{I2}{c} Zf(c-1) - (I1 + I2)\frac{Zf}{c}; \quad \text{(Eq. 6b)}$$

$$Vout = -I2 \cdot Zf - I1 \frac{Zf}{c}. \quad \text{(Eq. 6c)}$$

From Equation 6c, it will be appreciated that the trans-impedance gain from I2 to Vout is effectively c times the trans-impedance gain from I1 to Vout. In an exemplary embodiment c may be chosen to be approximately equal to a, so that the overall gain associated with each signal path is the same.

The output currents of trans-conductors 610, 620 are combined and coupled to an output resistance Ro 635, which converts the combined currents into an input voltage for the inverting buffer 605. In an exemplary embodiment, Ro 635 need not be associated with a separately provided physical resistor, but may simply be the total impedance present at that node due to, e.g., the input impedance of the buffer 605, etc. Alternatively, Ro 635 may be associated with a separately provided physical resistor (not shown in FIG. 6).

An inverting buffer 605 is further provided at the outputs of the transconductors 610, 620. It will be appreciated that the buffer 605 generally performs a buffering function between the trans-conductors 610, 620 and subsequent loads (not shown) coupled to the output voltage Vout. Accordingly, in certain alternative exemplary embodiments, the buffer 605 may be omitted within the scope of the present disclosure. Note in such alternative exemplary embodiments omitting a buffer 605, the inversion function that would otherwise be provided by a buffer 605 may alternatively be provided, e.g., by including an inversion gain in the transconductors 610 and/or 620, and/or accordingly switching the coupling of signals to the differential input terminals. Such alternative exemplary embodiments are contemplated to be within the scope of the present disclosure.

Figure 7:
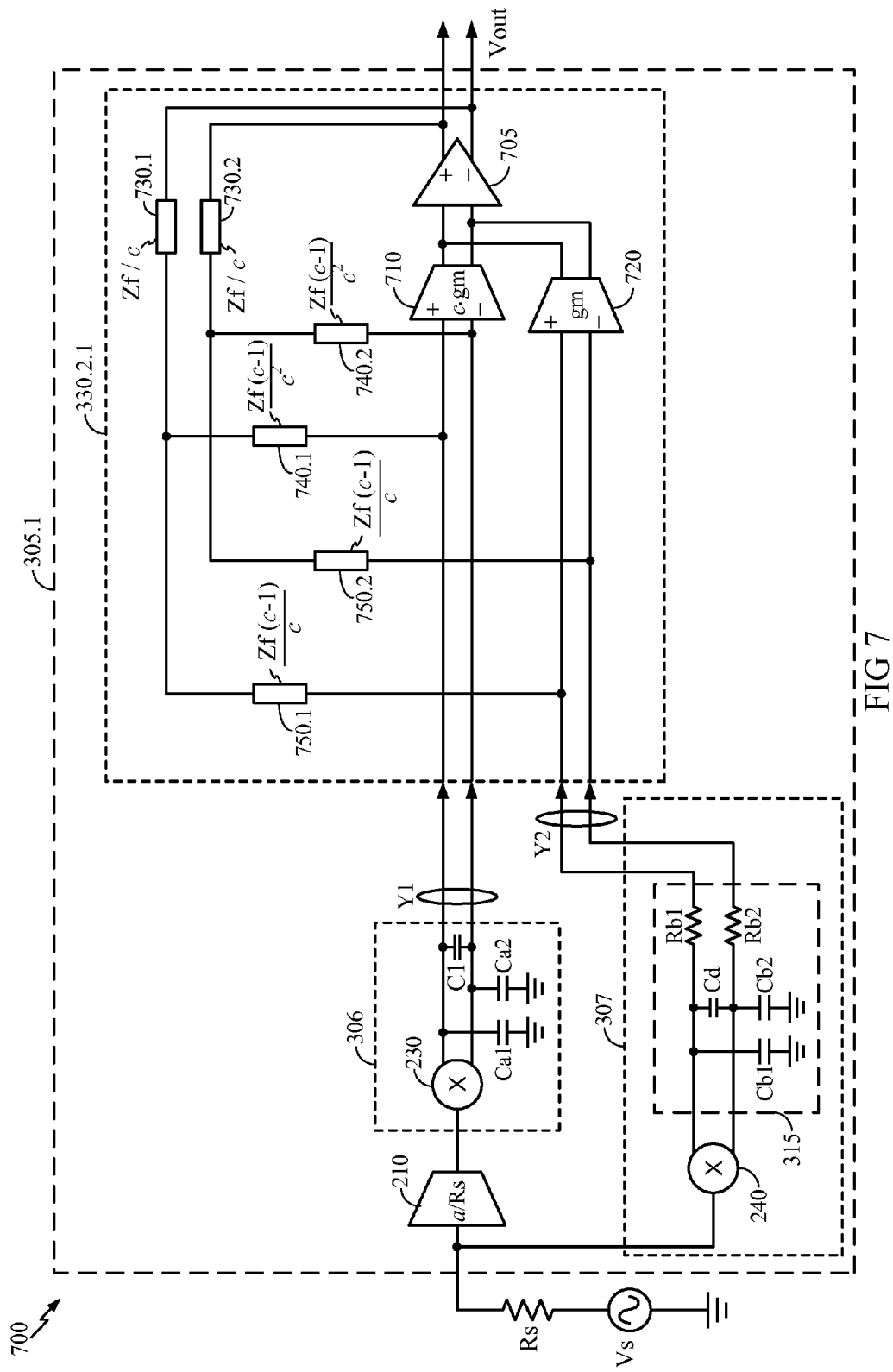
FIG. 7 illustrates an exemplary embodiment of a receiver employing a dual differential input trans-impedance amplifier (TIA) incorporating certain of the techniques described with reference to FIG. 6 hereinabove.

FIG. 7 illustrates an exemplary embodiment 700 of a receiver employing a dual differential input trans-impedance amplifier (TIA) 330.2.1 incorporating certain of the techniques described with reference to FIG. 6 hereinabove. Note similarly labeled elements in FIGS. 6 and 7 may perform similar functions, unless otherwise noted. Further note that FIG. 7 is shown for illustrative purposes only, and is not meant to limit the scope of the present disclosure.

In FIG. 7, the TIA 330.2.1 includes first and second differential trans-conductors 710, 720 processing differential input and output signals. In an exemplary embodiment, the functions of block 710, 720 are similar to those described for blocks 610, 620 of FIG. 6, except that the blocks 710, 720 accommodate differential rather than single-ended signals. The buffer 705 further accepts a differential input voltage to generate a differential output voltage Vout. Furthermore, in FIG. 7, a resistance Ro is not explicitly shown as being coupled to the input to the buffer 705, although it will be appreciated that an output resistance or impedance may nevertheless be present. Note that the differential impedance elements 730.1/730.2, 740.1/740.2, 750.1/750.2 may have functionality corresponding to that described for single-ended elements 630, 640, and 650, respectively, in FIG. 6.

Figure 8:
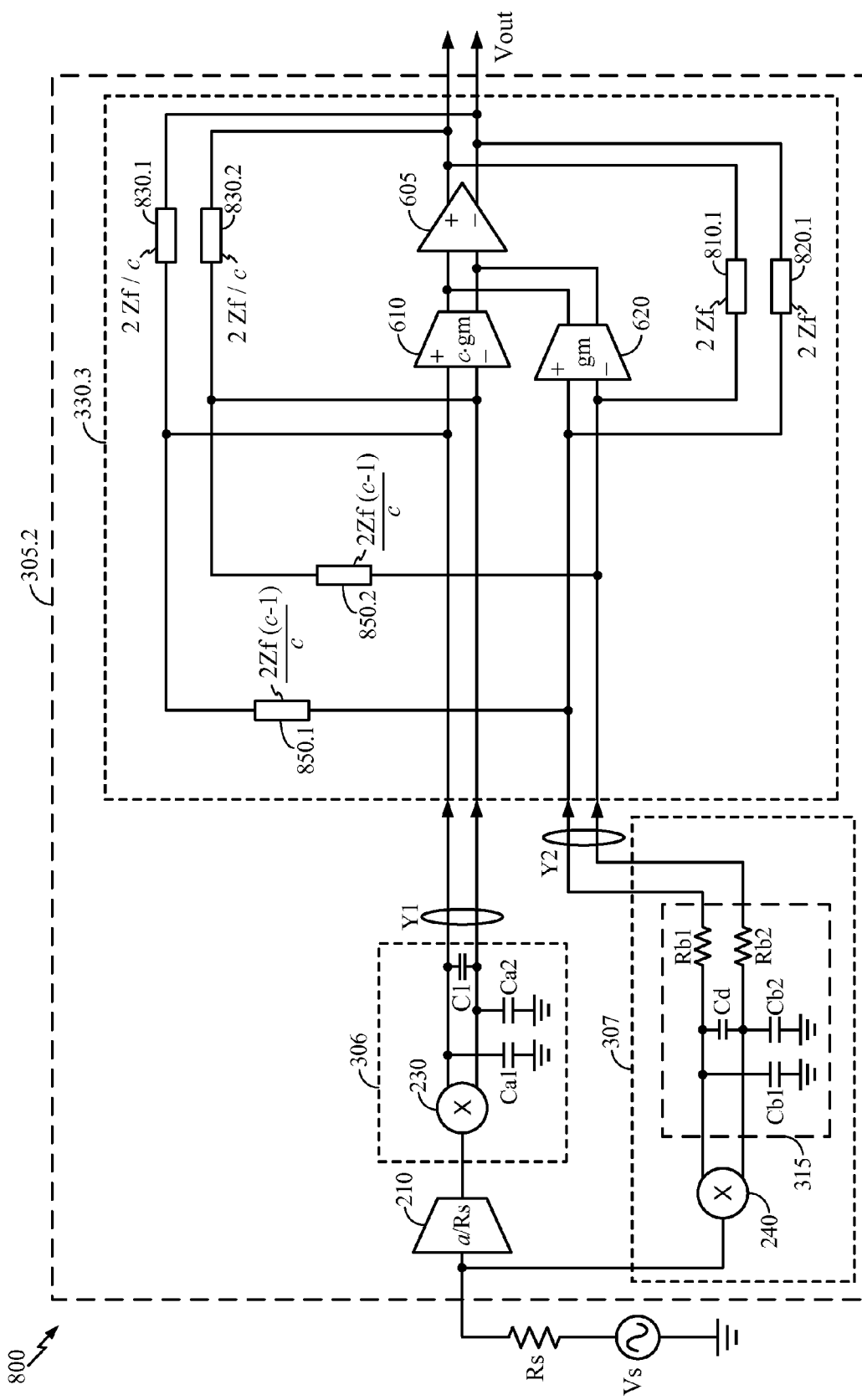
FIG. 8 illustrates an alternative exemplary embodiment of a noise cancelling receiver according to the present disclosure.

FIG. 8 illustrates an alternative exemplary embodiment of a noise cancelling receiver 800 according to the present disclosure. Note FIG. 8 is shown for illustrative purposes only, and is not meant to limit the scope of the present disclosure.

In FIG. 8, a technique known in the art as a "star-to-delta transformation" may be applied to the feedback network topology of the TIA 330.2.1 of FIG. 7 to derive an equivalent circuit topology 330.3 for the TIA. In certain exemplary embodiments, as elements 810.1 and 820.1 each correspond to a value of 2 Zf, the feedback network elements of TIA 330.3 may advantageously be implemented using a smaller area (since a higher value of impedance corresponds to a lower value of capacitance, which may accordingly be implemented using less area).

It will be appreciated in view of the exemplary feedback networks shown in FIG. 7 (whose feedback network is also denoted herein as a "star-connected feedback network") and FIG. 8 (whose feedback network is also denoted herein as a "delta-connected feedback network") that alternative equivalent feedback networks may readily be derived by one of ordinary skill in the art in light of the principles disclosed herein. Alternatively, non-equivalent feedback configurations (e.g., having different gains from what is shown in FIG. 7 or FIG. 8) may also be applied to a TIA consistent with the principles of the present disclosure. Such alternative exemplary embodiments are contemplated to be within the scope of the present disclosure.

Figure 9:
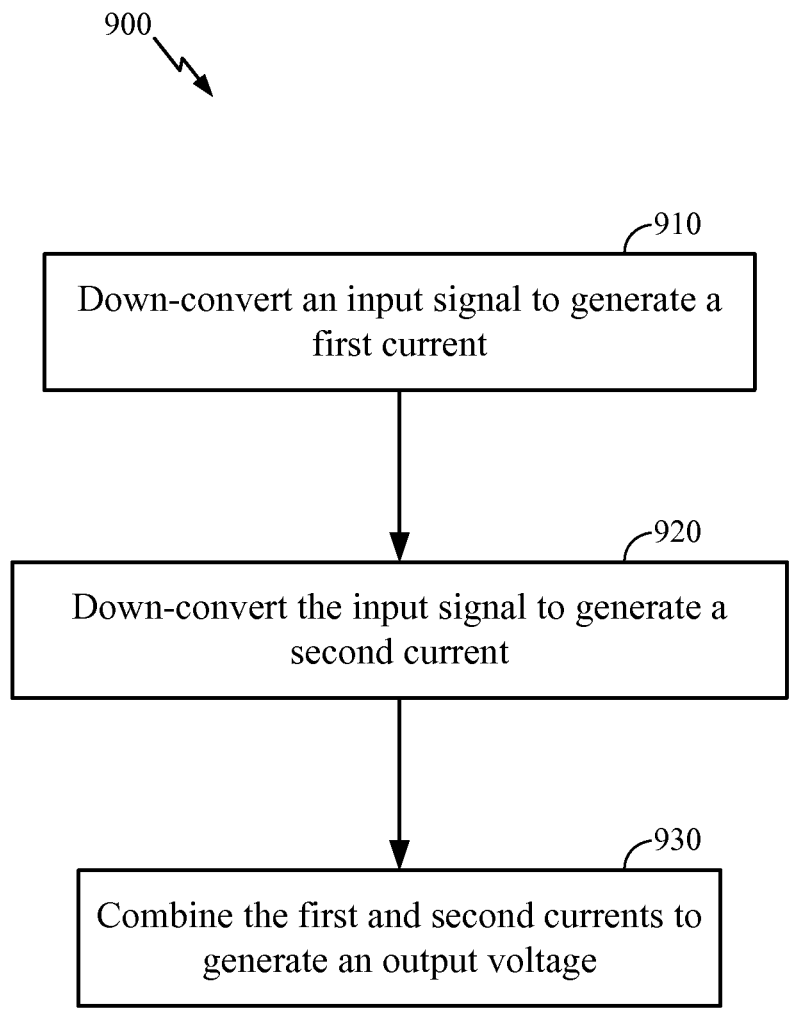
FIG. 9 illustrates an exemplary embodiment of a method according to the present disclosure.

FIG. 9 illustrates an exemplary embodiment of a method 900 according to the present disclosure. Note FIG. 9 is shown for illustrative purposes only, and is not meant to limit the scope of the present disclosure to any particular method shown.

In FIG. 9, at block 910, an input signal is down-converted to generate a first current.

At block 920, the input signal is down-converted to generate a second current. In an exemplary embodiment, the generating the second current comprises converting the input signal down in frequency using a passive mixer, and passing the down-converted input signal through a resistance-capacitance (RC) network.

At block 930, the first and second currents are combined to generate an output voltage.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
    a trans-conductor coupled to a first mixer to output a first signal to a trans-impedance amplifier (TIA), the TIA comprising a first trans-conductor having a first trans-conductance gain and a second trans-conductor having a second trans-conductance gain, an input to the first trans-conductor coupled to the output of the first mixer, an input to the second trans-conductor coupled to the output of an R-C network, the output of the first trans-conductor directly connected to the output of the second trans-conductor;
    the R-C network having an input coupled to the output of a passive mixer, and to output a second signal to the TIA to generate an output voltage; and
    a buffer stage having an input coupled to the first and second trans-conductor outputs.

2. The apparatus of claim 1, the R-C network comprising: capacitors coupled to the output of the passive mixer; and resistors coupled in series between the passive mixer and the TIA.

3. The apparatus of claim 1, the passive mixer comprising a differential output, the R-C network comprising:
   first and second grounding capacitors, each grounding capacitor coupling a node of the differential output to a ground voltage;
   a differential coupling capacitor coupling the nodes of the differential output to each other; and
   first and second resistors, each resistor coupling a node of the differential output in series with the output of the passive mixer.

4. The apparatus of claim 1, the TIA having a differential input and a differential output, differential outputs of the first and second receive signal path coupled to the differential input, and the differential output of the TIA coupled to the differential input of the TIA via a feedback network.

5. An apparatus comprising:
   a trans-conductor coupled to a first mixer to output a first signal to a trans-impedance amplifier (TIA), the TIA comprising a first trans-conductor having a first trans-conductance gain and a second trans-conductor having a second trans-conductance gain, an input to the first trans-conductor coupled to the output of the first mixer, an input to the second trans-conductor coupled to the output of an R-C network, the output of the first trans-conductor directly connected to the output of the second trans-conductor;
   the R-C network having an input coupled to the output of a passive mixer, and to output a second signal to the TIA to generate an output voltage; and
   a star-connected feedback network coupling the TIA output to the trans-conductor inputs.

6. An apparatus comprising:
   a trans-conductor coupled to a first mixer to output a first signal to a trans-impedance amplifier (TIA), the TIA comprising a first trans-conductor having a first trans-conductance gain and a second trans-conductor having a second trans-conductance gain, an input to the first trans-conductor coupled to the output of the first mixer, an input to the second trans-conductor coupled to the output of an R-C network, the output of the first trans-conductor directly connected to the output of the second trans-conductor;
   the R-C network having an input coupled to the output of a passive mixer, and to output a second signal to the TIA to generate an output voltage; and
   a delta-connected feedback impedance network coupling the TIA output to the trans-conductor inputs.

* * * * *